United States Patent
Shur et al.

(10) Patent No.: US 8,053,271 B2
(45) Date of Patent: Nov. 8, 2011

(54) DEVICE AND METHOD FOR MANAGING RADIATION

(75) Inventors: Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 12/628,499

(22) Filed: Dec. 1, 2009

(65) Prior Publication Data

US 2010/0072407 A1 Mar. 25, 2010

Related U.S. Application Data

(63) Continuation of application No. 11/111,541, filed on Apr. 21, 2005, now Pat. No. 7,638,817.

(60) Provisional application No. 60/565,351, filed on Apr. 26, 2004.

(51) Int. Cl.
 *H01L 31/07* (2006.01)
(52) U.S. Cl. .......... 438/94; 257/194; 257/E31.076; 257/187
(58) Field of Classification Search .......... 257/187; 438/94
 See application file for complete search history.

(56) References Cited

U.S. PATENT DOCUMENTS

| 5,914,497 | A | 6/1999 | Sherwin | |
|---|---|---|---|---|
| 6,178,275 | B1 * | 1/2001 | Nerses et al. | 385/14 |
| 7,619,263 | B2 * | 11/2009 | Shur et al. | 257/198 |
| 2004/0201076 | A1 | 10/2004 | Shur et al. | |

OTHER PUBLICATIONS

Rodwell, M., "Preface: High Speed Integrated Circuit Technology, Towards 100 GHz Logic," International Journal of High Speed Electronics and Systems, V.11, N.1, Mar. 2001, printed from http://www.worldscinet.com/ijhses/11/1101/S0129156401000769.html on Nov. 4, 2003.

Dyakonov, M., et al., "Plasma Wave Electronics: Novel Terahertz Devices using Two Dimensional Electron Fluid," Special Issue on Future Directions in Device Science and Technologies, IEEE Transactions on Electron Devices, V.43, N.10, Oct. 1996, pp. 1640-1645.

Dyakonov, M., et al., "Plasma Wave Electronics for Terahertz Applications," Terahertz Sources and Systems, R. E. Miles, P. Harrison, and D. Lippens, Editors, NATO Science Series, II. Mathematics, Physics and Chemistry, V.27, Kluwer Academic Publishers, Dordrecht/ Boston/ London, 2001, pp. 187-207 in textbook, pp. 1-21.

Shur, M., et al., "Two Dimensional Electrons in Field Effect Transistors," International Journal of High Speed Electronics and Systems, V.9, N.1, Mar. 1998, pp. 65-99, pp. 1-34.

(Continued)

*Primary Examiner* — Jerome Jackson, Jr.
(74) *Attorney, Agent, or Firm* — John W. LaBatt; Hoffman Warnick LLC

(57) ABSTRACT

A device and method for managing terahertz and/or microwave radiation are provided. The device can comprise one or more field effect transistors (FETs) that each include at least one channel contact to a central region of the device channel of the FET. The frequency of the radiation managed by the device can be tuned/adjusted by applying a bias voltage to the FET. The radiation can be impinged on the device, and can be detected by measuring a voltage that is induced by the radiation. Further, the device can generate terahertz and/or microwave radiation by, for example, inducing a voltage between two edge contacts on either side of the device channel and applying the voltage to the channel contact.

7 Claims, 9 Drawing Sheets

OTHER PUBLICATIONS

Ryzhii, V., et al., "Resonant Detection and Frequency Multiplication of Terahertz Radiation Utilizing Plasma Waves in Resonant-Tunneling Transistors," Journal of Applied Physics, V.88, N.5, Sep. 1, 2000, pp. 2868-2871.

Ryzhii, V., et al., "Terahertz Photomixing in Quantum Well Structures Using Resonant Excitation of Plasma Oscillations," Journal of Applied Physics, V.91, N.4, Feb. 15, 2002, pp. 1875-1881.

Shur, M., et al., "Ballistic Transport in Semiconductor at Low Temperatures for Low-Power High-Speed Logic," IEEE Transactions on Electron Devices, V.ED-26, N.11, Nov. 1979, pp. 1677-1683.

Timp, G., et al., "The Ballistic Nano-Transistor," IEDM Tech. Digest, 1999, pp. 55-58.

Kawaura, H., et al., "Transistor Characteristics of 14-nm-Gate-Length EJ-MOSFET's," IEEE Transactions on Electron Devices, V.47, N.4, Apr. 2000, pp. 856-860.

Dyakonov M., et al., "Detection, Mixing, and Frequency Multiplication of Terahertz Radiation by Two-Dimensional Electronic Fluid", IEEE Transactions on Electron Devices, V.43, N.3, Mar. 1996, pp. 380-387.

Dyakonov M., et al., "Shallow Water Analogy for a Ballistic Field Effect Transistor: New Mechanism of Plasma Wave Generation by dc Current," Physical Review Letters, V.71, N.15, Oct. 11, 1993, pp. 2465-2468.

Knap, W., et al., "Terahertz Emission by Plasma Waves in 60 nm Gate High Electron Mobility Transistors," Applied Physics Letters, V.84, N.13, Mar. 29, 2004, pp. 2331-2333.

Shur, M., et al., "Plasma Wave Electronics," Terahertz Sensing Technology, vol. 1 Electronic Devices & Advanced Technology, World Scientific, 2003, also in IJHSES, V.13, N.2, 2003, pp. 575-600, pp. 1-26.

Chaplik, A., "Possible Crystallization of Charge Carriers in Low-Density Inversion Layers," Sov. Phys. JETP, V.35, N.2, Aug. 1972, pp. 395-398.

Nakayama, M., "Theory of Surface Waves Coupled to Surface Carriers," Journal of the Physical Society of Japan, V.36, N.2, Feb. 1974, pp. 393-398.

Allen, Jr., S. et al., "Observation of The Two-Dimensional Plasmon in Silicon Inversion Layers," Phys. Rev. Lett. V.38, N.17, Apr. 25, 1977, pp. 980-983.

Tsui, D., et al., "Far Infrared Emission from Plasma Oscillations of Si Inversion Layers," Solid State Communicatons, V.35, N.11, 1980, pp. 875-877.

Burke, P., et al., "High Frequency Conductivity of the High-Mobility Two-Dimensional Electron Gas," Applied Physics Letters, V.76, N.6, Feb. 7, 2000, pp. 745-747.

Lü, J., et al., "A Resonant Terahertz Detector Utilizing a High Electron Mobility Transistor," IEDM'98 Technical Digest, San Francisco, CA, Dec. 1998, pp. 453-456.

Knap, W., et al., "Resonant Detection of Subterahertz Radiation by Plasma Waves in the Submicron Field Effect Transistor," Applied Physics Letters, V.80, N.18, May 6, 2002, pp. 3433-3435.

Peralta, X., et al., "THz Detection by Resonant 2-D Plasmons in Field Effect Devices, in Frontiers in Electronics: Future Chips," Proceedings of the 2002 Workshop on Frontiers in Electronics (WOFE-02) St. Croix, Virgin Islands, World Scientific Pub Co; Jan. 15, 2003, ISBN: 9812382224, V.26. Series Selected Topics in Electronics and Systems, also in International Journal of High Speed Electronics and Systems, V.12, N.3, 2002, pp. 925-937, pp. 333-345.

Crowe, T., et al., "Terahertz GaAs Devices and Circuits for Heterodyne Receiver Applications," Compound Semiconductor Electronics The Age of Maturity, M. S. Shur (ed.), World Scientific, 1996, pp. 209-245.

Satou, A., et al., "Characteristics of a Terahertz Photomixer Based on a High-Electron Mobility Transistor Structure with Optical Input Through the Ungated Regions," J. Appl. Phys., V.95, No. 4, Feb. 15, 2004, pp. 2084-2089.

Popov, V., et al., "Resonant Terahertz Response of a Slot Diode with a Two-Dimensional Electron Channel," $12^{th}$ Int. Symp. "Nanostructures: Physics and Technology," St. Petersburg, Russia, Jun. 21-25, 2004, pp. 1-2.

U.S. Appl. No. 11/111,541, "Office Action", Dated Nov. 28, 2007, 10 pages.

U.S. Appl. No. 11/111,541, "Amendment", filed Feb. 28, 2008, 10 pages.

U.S. Appl. No. 11/111,541, "Final Office Action", Dated Jun. 6, 2008, 7 pages.

U.S. Appl. No. 11/111,541, "After-Final Amendment", filed Sep. 3, 2008, 14 pages.

U.S. Appl. No. 11/111,541, "Office Action", Dated Nov. 17, 2008, 6 pages.

U.S. Appl. No. 11/111,541, "Amendment", filed Mar. 17, 2009, 13 pages.

U.S. Appl. No. 11/111,541, "Final Office Action", Dated Jun. 3, 2009, 6 pages.

U.S. Appl. No. 11/111,541, "After-Final Amendment", filed Jul. 31, 2009, 8 pages.

U.S. Appl. No. 11/111,541, "Notice of Allowance", Dated Aug. 14, 2009, 5 pages.

* cited by examiner

DEVICE AND METHOD FOR MANAGING RADIATION

CROSS-REFERENCE TO RELATED APPLICATIONS

The current application is a continuation application of U.S. Utility application Ser. No. 11/111,541, filed on 21 Apr. 2005 now U.S. Pat. No. 7,638,817, which claims the benefit of U.S. Provisional Application No. 60/565,351, filed on Apr. 26, 2004, both of which are hereby incorporated herein by reference.

BACKGROUND OF THE INVENTION

1. Technical Field

The invention relates generally to managing electromagnetic radiation, and more particularly, to a device and method for managing electromagnetic radiation having a frequency in the terahertz and/or microwave ranges.

2. Background Art

The terahertz range of frequencies corresponds to frequencies between three hundred gigahertz (GHz) and thirty terahertz (THz). This range lies in between the frequency ranges of electronic devices (that typically operate at frequencies below three hundred GHz) and photonic devices (that typically operate at frequencies above five to thirty THz). For example, the upper frequency that can be attained using an electronic transistor is typically limited by the transit time of carriers under the gate (for a field effect transistor) or across the base and collector depletion region (for a bipolar junction transistor). The feature sizes of some of these devices, such as silicon metal oxide semiconductor field effect transistors (MOSFETs), compound semiconductor heterostructure field effect transistors (HFETs), and heterojunction bipolar transistors, can be scaled to obtain device parameters into the terahertz range (i.e., transistor operation at frequencies of a few hundred GHz). However, fundamental physics limitations, such as the size of the gate length versus the wave length of the terahertz radiation, limit the extent of the device scaling and the transit time limited regimes face are not effective for the terahertz range of frequencies. Photonic devices also have been created that approach the terahertz gap using interband or intersubband transitions. However, these devices must operate at cryogenic temperatures due to the smaller quanta of terahertz radiation versus thermal energy at room and liquid nitrogen temperatures.

Plasma wave oscillations (which are oscillations of electron density in time and space) and their possible uses continue to be explored. Plasma waves for a field effect transistor have also been analyzed. To this extent, infrared absorption and weak infrared emission related to such waves have been observed in silicon inversion layers. More recently, studies of high mobility AlGaAs/GaAs gated heterostructures revealed the resonance impedance peaks related to the plasma waves. Further, one study used hydrodynamic equations to analyze plasma waves in 2D electron gas and predicted the instability of plasma waves in a high mobility field effect transistor.

Some studies are now focusing on plasma wave electronic devices, such as detectors and mixers. One such study reported evidence of resonant plasma wave detection by a field effect transistor at the third harmonic. More recently, other studies have reported resonant plasma wave detection at the fundamental harmonic by a field effect transistor and in multi-gated periodic structures with 2D electron gas.

Two difficulties must be overcome to use plasma waves for terahertz oscillators, detectors, mixers, and multipliers. First, highly non-symmetrical boundary conditions, e.g., an open drain and short-circuited source, are required for efficient operation. Second, since the plasma wave velocity is much smaller than the light velocity and device dimensions are much smaller than the electromagnetic wave length that corresponds to the plasma frequency, antenna structures are needed for coupling plasma waves and electronic waves. However, these antenna structures are much larger than typical devices. To this extent, the coupling of the antenna structures for electromagnetic radiation and the integration of a device with sub-millimeter circuits needs to be addressed for the implementation of practical plasma wave devices. These issues, and the antenna and circuit design, have been investigated for submicron Schottky diodes operating in the terahertz range.

To this extent, a need exists for a solution that overcomes these limitations. In particular, there exists a need for a device and method for managing radiation, such as terahertz and/or microwave radiation, using plasma wave oscillations.

SUMMARY OF THE INVENTION

The invention uses plasma waves to manage terahertz and/or microwave radiation. In particular, the invention uses a deep submicron field effect transistor (FET), in which plasma frequencies are typically in the terahertz range. As a result, plasma wave excitation can be used to manage terahertz and/or microwave radiation. To this extent, the invention provides a device and method for managing (e.g., generating, mixing, detecting, manipulating, etc.) terahertz and/or microwave radiation. The device can comprise one or more FETs that each include at least one channel contact to a central region of the device channel of the FET. The frequency of the radiation managed by the device can be tuned/adjusted by applying a bias voltage to, for example, the gate of the FET. The radiation can be impinged on the device, and can be detected by measuring a voltage that is induced by the radiation. Further, the device can generate terahertz and/or microwave radiation by, for example, inducing a voltage between two edge contacts on either side of the device channel and applying the voltage to the channel contact. By using symmetrical plasma modes, the invention manages the radiation without requiring any asymmetry in the boundary conditions and provides an efficient solution for coupling to the terahertz radiation.

A first aspect of the invention provides a device for managing radiation, the device comprising a field effect transistor that includes: an active layer that includes a device channel; a gate formed above the active layer; at least one channel contact to a central region of the device channel; a first edge contact to the device channel disposed adjacent to a first edge of the device channel; and a second edge contact to the device channel disposed adjacent to a second edge of the device channel.

A second aspect of the invention provides a method of managing radiation, the method comprising: obtaining a device, the device including at least one field effect transistor that includes: an active layer that includes a device channel; a gate formed above the active layer; at least one channel contact to a central region of the device channel; a first edge contact to the device channel disposed adjacent to a first edge of the device channel; and a second edge contact to the device channel disposed adjacent to a second edge of the device channel; impinging the radiation on the device; and detecting the radiation by measuring a voltage induced between the at least one channel contact and at least one of the edge contacts.

A third aspect of the invention provides a method of generating radiation, the method comprising: obtaining a device, the device including at least one field effect transistor that includes: an active layer that includes a device channel; a gate formed above the active layer; at least one channel contact to a central region of the device channel; a first edge contact to the device channel disposed adjacent to a first edge of the device channel; and a second edge contact to the device channel disposed adjacent to a second edge of the device channel; inducing a voltage between the first and second edge contacts; and applying the voltage to the at least one channel contact.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
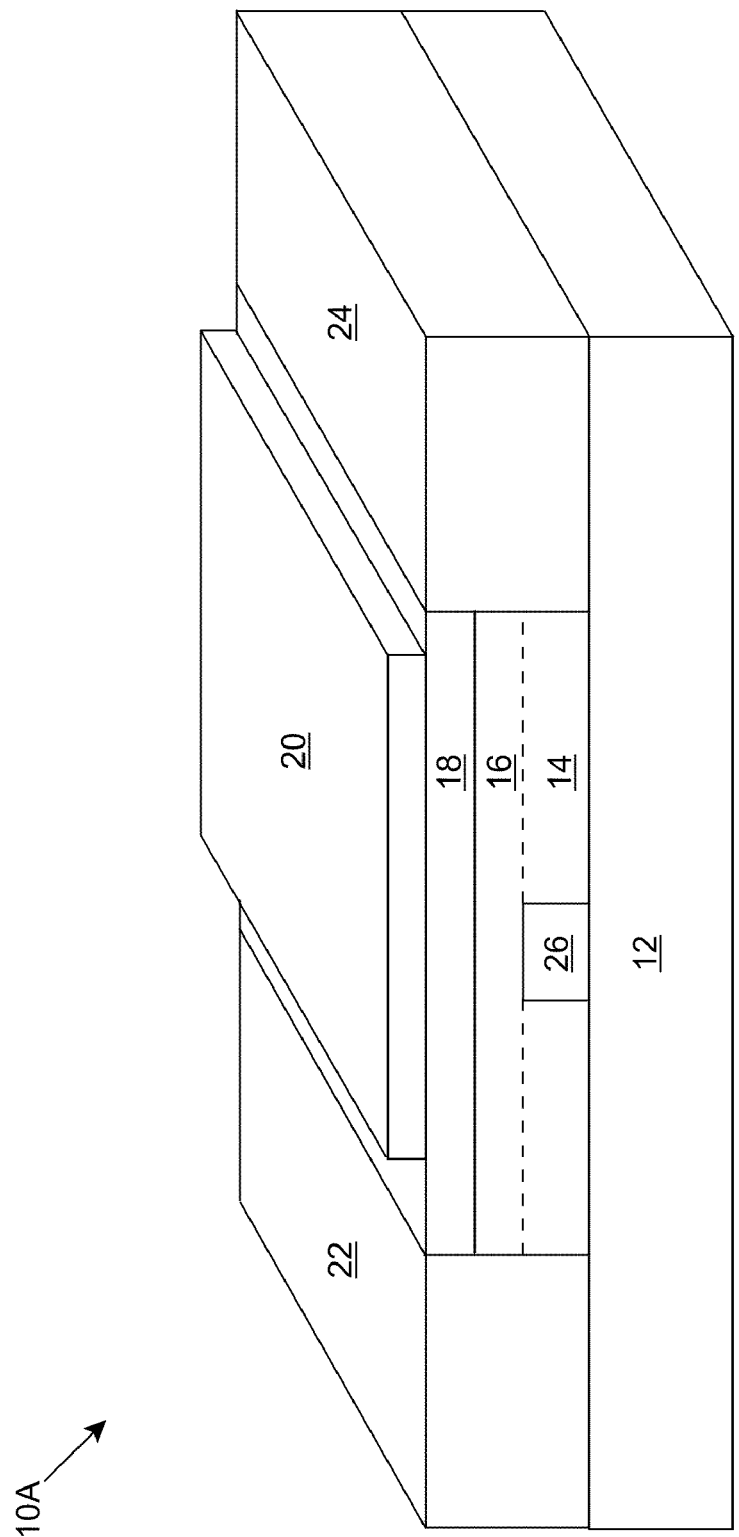
FIG. 1 shows an illustrative semiconducting device.

It is understood, that for purposes of this description Al means Aluminum, Ga means Gallium, N means Nitrogen, In means Indium, Si means Silicon, O means Oxygen, C means Carbon, As means Arsenic, Li means Lithium, Nb means Niobium, Ge means Germanium, Sb means Antimony, and P means Phosphorus. Further, it is understood that "group II elements" comprise the elements Beryllium (Be), Magnesium (Mg), Calcium (Ca), Strontium (Sr), Barium (Ba), and Radium (Ra), "group III elements" comprise the elements Al, Ga, In, Boron (B), and Thallium (Tl), "group IV elements" comprise the elements C, Si, Ge, Tin (Sn), and Lead (Pb), and "group VI elements" comprise the elements O, Sulfur (S), Selenium (Se), Tellurium (Te) and Polonium (Po). Still further, it is understood that "terahertz radiation" comprises radiation having a frequency between approximately 0.1 and 100 terahertz ($10^{12}$ hertz), and "microwave radiation" comprises radiation having a frequency between approximately 1 and 100 gigahertz ($10^9$ hertz).

As indicated above, the invention uses plasma waves to manage terahertz and/or microwave radiation. In particular, the invention uses a deep submicron field effect transistor (FET), in which plasma frequencies are typically in the terahertz range. As a result, plasma wave excitation can be used to manage terahertz and/or microwave radiation. To this extent, the invention provides a device and method for managing (e.g., generating, mixing, detecting, manipulating, etc.) terahertz and/or microwave radiation. The device can comprise one or more FETs that each include at least one channel contact to a central region of the device channel of the FET. The frequency of the radiation managed by the device can be tuned/adjusted by applying a bias voltage to, for example, the gate of the FET. The radiation can be impinged on the device, and can be detected by measuring a voltage that is induced by the radiation. Further, the device can generate terahertz and/or microwave radiation by, for example, inducing a voltage between two edge contacts on either side of the device channel and applying the voltage to the channel contact. By using symmetrical plasma modes, the invention manages the radiation without requiring any asymmetry in the boundary conditions and provides an efficient solution for coupling to the terahertz radiation.

The invention uses the excitation of plasma waves in a semiconducting device, such as a field effect transistor (FET), with feature sizes from tens of microns to several nanometers. Various properties of plasma waves in two dimensional electrons in a FET or in a quantum well structure enable this use. For example, in a deep submicron device, typical plasma frequencies are in the terahertz range. Further, the electron transit time might become comparable to, or even smaller than, the electron momentum relaxation time. Under such conditions, the electron transport approaches the ballistic regime. An important parameter is the product of the plasma frequency and the electron momentum relaxation time. If this product is greater than one, a channel of the FET becomes a resonant cavity for the plasma waves. The fundamental frequency of this cavity can be tuned by changing a gate bias. As a result, a high mobility deep submicron FET can be used for resonant detection, mixing, multiplication, and/or generation of radiation having a frequency in the terahertz range.

Turning to the drawings, FIG. 1 shows an illustrative semiconducting device 10A according to one embodiment of the invention. Device 10A is configured to operate as a field effect transistor (FET) and is shown including a substrate 12, an active layer 14 that includes a device channel 16, which comprises a two-dimensional (2D) electron or hole carrier gas, a barrier layer 18 separating active layer 14 from a gate 20, and two edge contacts 22, 24. Additionally, device 10A includes a channel contact 26 to device channel 16 that is formed below gate 20 in a portion of active layer 14. Channel contact 26 contacts device channel 16 in a central region (e.g., between edge contacts 22, 24) of device channel 16 and is used to enable device 10A to manage radiation as described herein. In particular, channel contact 26 taps into a point on device channel 16 that comprises a plasma wave amplitude at or near its maximum, thereby enabling, among other things, the detection of the radiation.

Device 10A can be manufactured using any approach now known or later developed. To this extent, it is understood that device 10A can include any type of substrate 12. For example, substrate 12 can comprise GaAs, InP, sapphire, SiC, spinel, silicon, bulk GaN, bulk AlN, bulk AlGaN, $LiGaO_2$, $LiNbO_3$, or the like. Similarly, active layer 14 can comprise any compound capable of including device channel 16, including, for example, Si, SiGe, Ge, AlGaAs, GaAs, AlN, GaN, InN, AlInAs, InSb, InP, etc. Further, barrier layer 18 can also comprise any compound capable of insulating active layer 14 from gate 20, including, for example, $SiO_2$, SiN, a binary, ternary, or quaternary compound that includes one, two, or three group III elements, respectively, and N or a group IV element, a compound that includes elements of groups II and VI, or a combination of layers of different compositions. Still further, contacts 22, 24, 26 can comprise any type of contact including, for example, a gold germanium contact.

Figure 2:
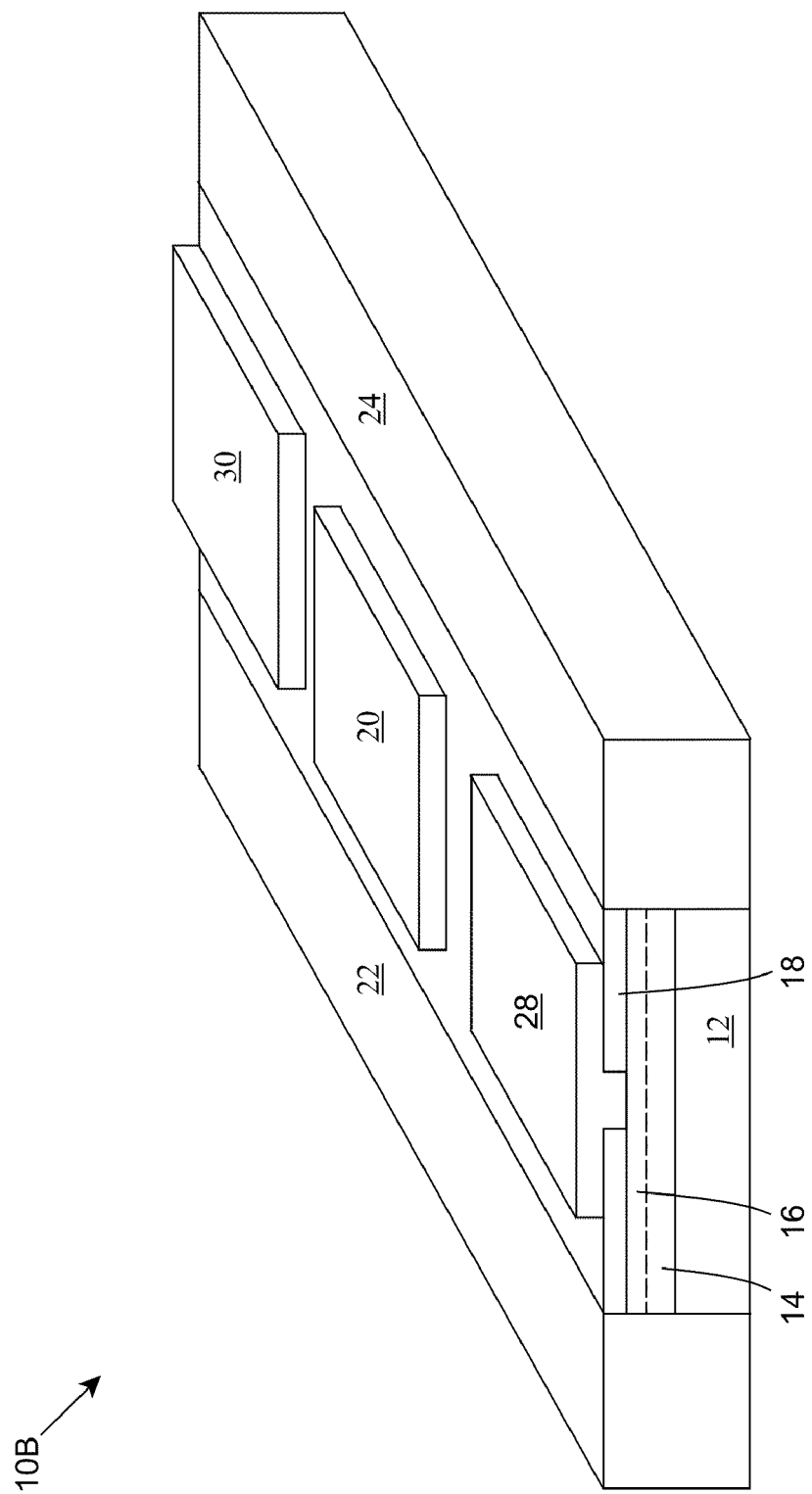
FIG. 2 shows an alternative semiconducting device.

Additionally, device 10A may include one or more additional layers and/or contacts not shown. Further, channel contact 26 is only illustrative of various configurations for contacting the central region of device channel 16. To this extent, FIG. 2 shows an alternative semiconducting device 10B according to another embodiment of the invention. Device 10B is shown including a substrate 12, an active layer 14 that includes a device channel 16, a barrier layer 18, and a gate 20, and two edge contacts 22, 24. Further, device 10B is shown including two surface channel contacts 28, 30 that contact device channel 16, through barrier layer 18, in a central region (e.g., between edge contacts 22, 24) of device channel 16. As shown, surface channel contacts 28, 30 are formed above barrier layer 18, adjacent to gate 20, and are located on opposite sides of gate 20. As with device 10A (FIG. 1), device 10B can be manufactured using any approach now known or later developed and comprise any type of elements as discussed above with reference to device 10A.

Figure 3:
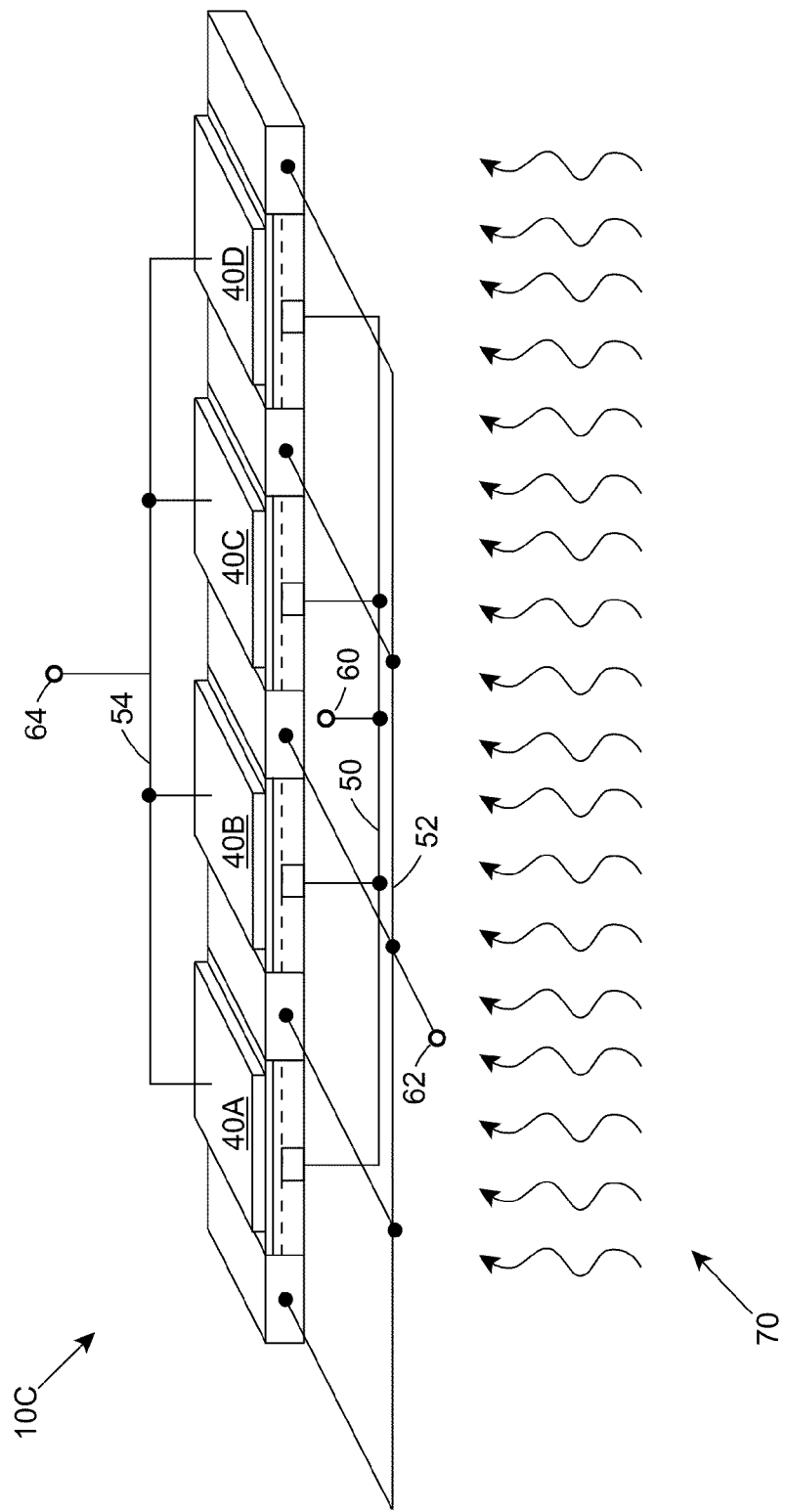
FIG. 3 shows another alternative device that includes multiple field effect transistors (FETs)
Figure 4:
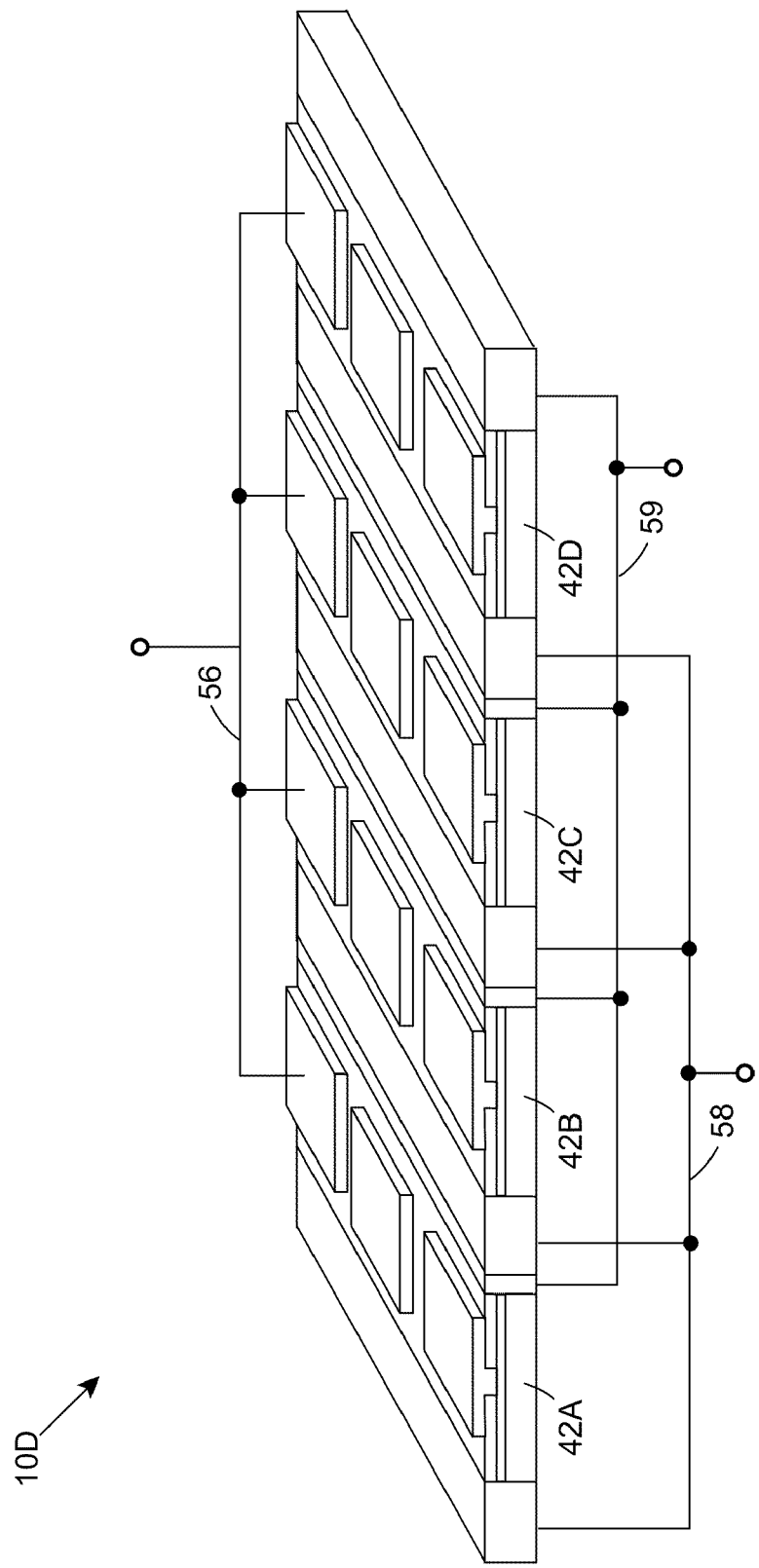
FIG. 4 shows still another alternative device that includes multiple FETs.

Additional embodiments of the device provided by the invention can comprise an array of field effect transistors. To this extent, FIG. 3 shows another alternative device 10C that includes a plurality of field effect transistors (FETs) 40A-D, each of which is configured in the same manner as device 10A (FIG. 1). As shown in FIG. 3, when FETs 40A-D are aligned as shown for device 10C, two adjacent FETs, such as FET 40A and FET 40B, can share an edge contact. FIG. 4 shows still another alternative device 10D that includes a plurality of FETs 42A-D, each of which is configured in the same manner as device 10B (FIG. 2). However, as shown in FIG. 4 the edge contacts for adjacent FETs, such as FET 42A and FET 42B, are not shared, but can operate independently of one another.

Referring to FIGS. 3 and 4, it is understood that while devices 10C-D are shown as having four FETs 40A-D, 42A-D, respectively, any number of FETs could be used. To this extent, device 10C and/or device 10D can comprise an overall dimension based on a desired wavelength (frequency) of the radiation. In particular, device 10C and/or 10D can include FETs of a size and/or a number of FETs that are selected based on the desired frequency of the radiation to be managed using the device. For example, device 10C and/or 10D can comprise dimensions comparable to or larger than an electromagnetic wave having a frequency approximately equal to the desired frequency of the excited plasma waves. In one embodiment, device 10C and/or 10D can have a dimension that is approximately equal to an integer number of a half wave of terahertz radiation managed by the device 10C-D.

The various FETs 40A-D, 42A-D can be interconnected to readily enable their common operation. For example, FIG. 3 shows FETs 40A-D being interconnected. In particular, the channel contact for each FETS 40A-D is connected by a set (one or more) of connectors 50, each edge contact is connected by another set of connectors 52, and each gate is connected by still another set of connectors 54. In this case, set of connectors 50 can include a drain contact 60, set of connectors 52 can include a source contact 62, and set of connectors 54 can include a gate contact 64. Various alternative connections are possible. For example, FIG. 4 shows FETs 42A-D having their respective surface channel contacts on one side of the gates connected by a set of connectors 56. It is understood that the various surface channel contacts on the other side of the gates could be independently interconnected in a similar fashion and/or interconnected with the surface channel contacts on the other side of the gates using the same set of connectors 56. These have not been shown for clarity. Further, FETs 42A-D are shown having each edge contact on a first side of the device channels connected by a first set of connectors 58, and each edge contact on a second side of the device channels connected by a second set of connectors 59. This enables independent operation of the respective edge contacts. Referring to both FIGS. 3 and 4, it is understood that connectors 50, 52, 54, 56, 58, 59 are only illustrative and the connections can be implemented using any known solution. To this extent, connections for devices 10C-D could be implemented such that they can be reconfigured based on a desired mode of operation for the devices 10C-D.

Figure 5:
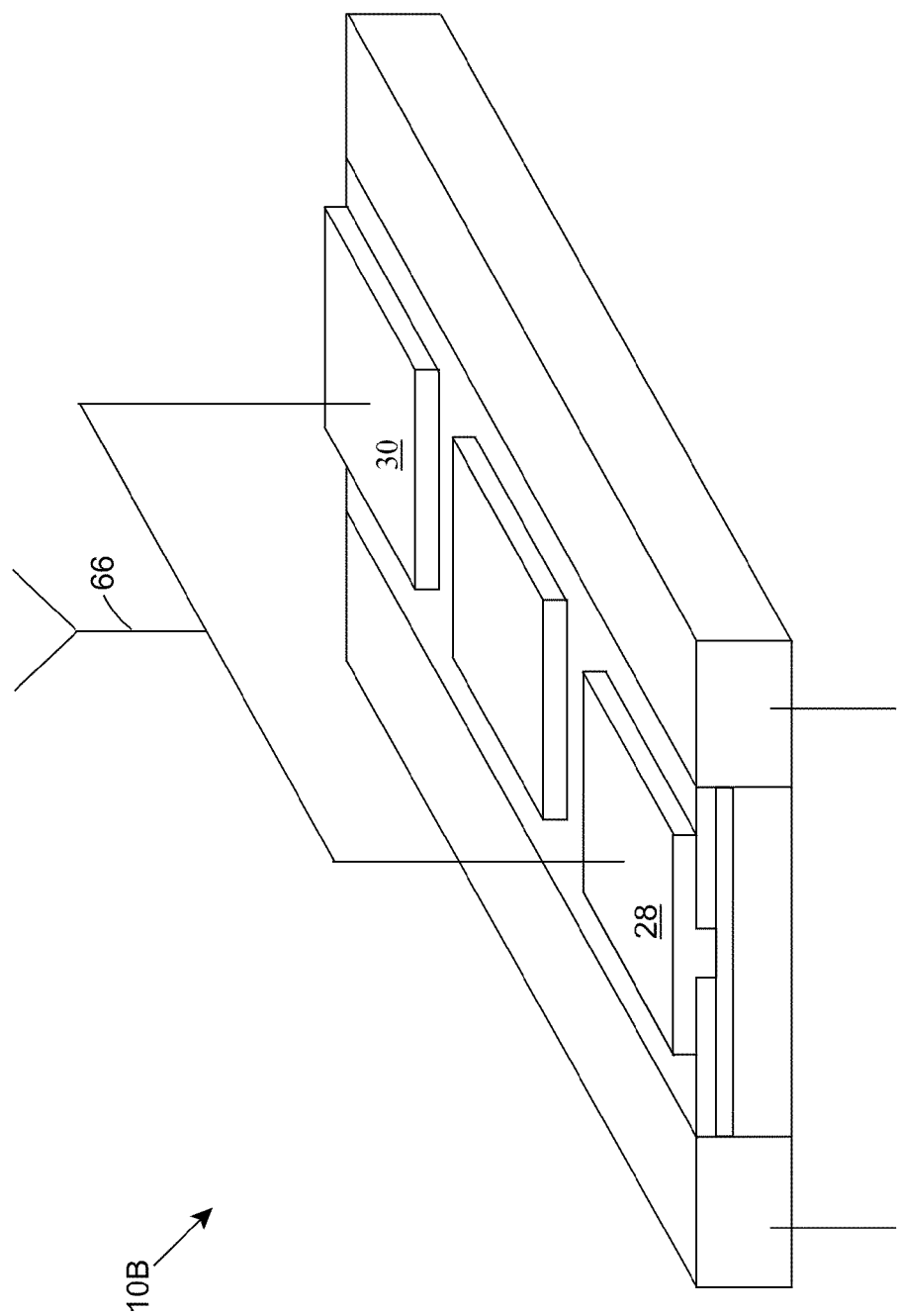
FIG. 5 shows the device of FIG. 2 having an antenna structure coupled thereto.

The various devices 10A-D (FIGS. 1-4) can be used to manage electromagnetic radiation having a frequency in the terahertz and/or microwave ranges. To this extent, one or more additional elements can be added to devices 10A-D in order to assist the device 10A-D in managing the electromagnetic radiation. For example, FIG. 5 shows device 10B having an antenna structure 66 coupled to surface channel contacts 28, 30. Antenna structure 66 can be used to transmit and/or receive the electromagnetic radiation managed by device 10B.

In any event, once a desired device 10A-D (FIGS. 1-5) is obtained (e.g., manufactured, purchased, installed, and/or configured), device 10A-D can be used to manage radiation, and in particular, terahertz and/or microwave radiation. In one embodiment, device 10A-D is used to manage (e.g., detect, mix, and/or manipulate) radiation that is received by device 10A-D. In this case, the radiation can be impinged on device 10A-D. For example, antenna 66 (FIG. 5) can be used to receive the terahertz and/or microwave radiation. Alternatively, as shown in FIG. 3, device 10C can be impinged directly by radiation 70.

In either case, the radiation induces a direct current (DC) voltage (or voltage at a modulated frequency such as used in the lock-in amplifier detection) between the at least one channel contact and either or both edge contacts. To this extent, the induced voltage can be detected by measuring a voltage difference between the channel contact(s) and at least one of the edge contact(s). For example, for device 10A of FIG. 1, the voltage difference between edge contact 22 and channel contact 26 and/or the voltage difference between edge contact 24 and channel contact 26 could be measured. Similarly, for device 10C of FIG. 3, the voltage difference can be measured between a contact for set of connectors 50 and a contact for set of connectors 52.

The measured voltage is induced by radiation having a particular frequency. A target frequency of the detected radiation can be tuned to a particular frequency of interest. For example, a bias DC voltage can be applied to the gate. In particular, for device 10C of FIG. 3, the bias voltage can be applied to gate contact 64. In this case, the bias voltage for gate contact 64 can be adjusted to tune to the frequency of interest. It is understood that applying the bias voltage to gate contact 64 is only illustrative and the bias voltage can be applied to a particular device 10A-D (FIGS. 1-5) using various alternatives. For example, in addition to or alternative to applying the bias voltage to the gate(s) of the device 10A-D, a bias voltage can be applied between the channel contact and one or both of the edge contacts of a FET and/or between both edge contacts of a FET, in order to tune the frequency of the detected radiation.

In addition to detecting radiation 70, devices 10A-D (FIGS. 1-5) can mix radiation 70 with additional radiation. To this extent, devices 10A-D can be used to generate electromagnetic radiation having a frequency in the terahertz range and/or microwave range. In particular, a voltage can be induced between two edge contacts, such as edge contacts 22, 24 of device 10A in FIG. 1. In one embodiment, the voltage is induced by the impinging the terahertz and/or microwave radiation on device 10A. Alternatively, the voltage can be provided from a voltage source as is known in the art. In either case, the voltage can be applied to the channel contact 26. Once applied, device 10A will generate the electromagnetic radiation, which can be transmitted via an antenna structure 66 (FIG. 5). Similar to the detection described above, a frequency of the generated radiation can be tuned by, for example, adjusting a bias voltage applied to gate 20. By generating radiation that is combined with other radiation 70 (FIG. 3), devices 10A-D (FIGS. 1-5) can adjust one or more attributes of radiation 70. For example, devices 10A-D can generate radiation at a new frequency that is equal to the sum/difference of a frequency of the generated radiation and a frequency of radiation 70. Alternatively, devices 10A-D can be illuminated with two or more radiation beams, and devices 10A-D can use the heterodyne detection and/or generate radiation with a frequency equal to the sum/difference of the frequencies of the radiation beams. It is understood that these applications are only illustrative, and various others are possible as will be recognized by on in the art.

Further details of the properties, as currently understood, that enable the invention are now described for completeness. Returning to FIG. 1, for identical boundary conditions at the source and drain sides of device channel 16, the frequencies of plasma oscillations under gate 20 are given by the equation:

$$\omega_n = \frac{\pi s}{L_{eff}} n \ (n = 1, 2, 3 \ldots ), s = \sqrt{\frac{eU_0}{m}}, \quad (1)$$

where s is the plasma wave velocity, $L_{eff}$ is the effective gate length related to the geometrical gate length L by $L_{eff}=L+2d$, where d is the gate-to-channel distance, e and in are the electronic charge and effective mass, respectively, and $U_0$ is the effective gate-to-channel voltage swing, which is the difference between the gate voltage $U_g$ and the channel depletion threshold voltage $U_{th}$ ($U_0=U_g-U_{th}$). The effective electron sheet density in the channel can be approximately estimated using the parallel plate capacitor model as $n_s=\in\in_0 U_0/(ed)$, where $\in$ is the dielectric constant of the gate barrier layer. For typical parameters of an InGaAs high-electron-mobility transistor with nanometer gate L=40 nm, d=10 nm, $\in$=13.88, $n_s=3\times10^{12}$ cm$^{-2}$, m=0.042 $m_0$, where $m_0$ is the free-electron mass, equation (1) yields the fundamental plasmon frequency (n=1) of about ten THz.

Figure 6:
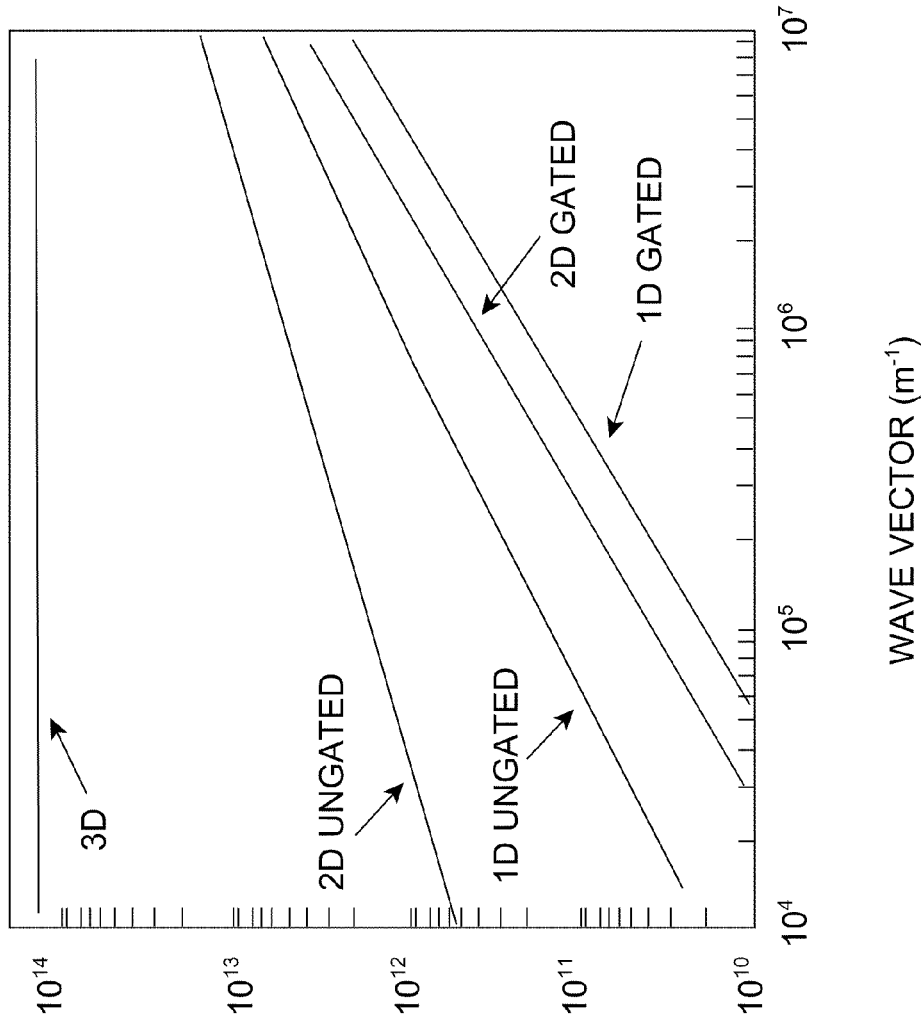
FIG. 6 shows the dispersion relations for plasma waves of different device geometries.

The dispersion relations for plasma waves can be derived from the small signal equation of motion and the continuity equation. To this extent, FIG. 6 shows the dispersion relations of plasma waves for different device geometries. In calculating the dispersion curves, the parameters included: a dielectric constant, $\in_r$=12.9; an effective mass, $m_r$=0.067 $m_0$; a 3D electron concentration, $n_{3d}$=5×10$^{24}$ m$^{-3}$; a 2D electron concentration, $n_{2d}$=1.5×10$^{12}$ m$^{-2}$; a 1D electron concentration, $n_{1d}$=1.41×10$^8$ m$^{-1}$; a gate-to-channel separation for the 1D gated structures, $d_o$=3 nm; and a quantum wire radius, r=3 nm. The similarity between the dispersion relations for the gated 2D electron gas case and gated and ungated 1D electron gas case implies that the results discussed herein for the gated 2D electron gas should equally apply to gated and ungated quantum wires.

Figure 7:
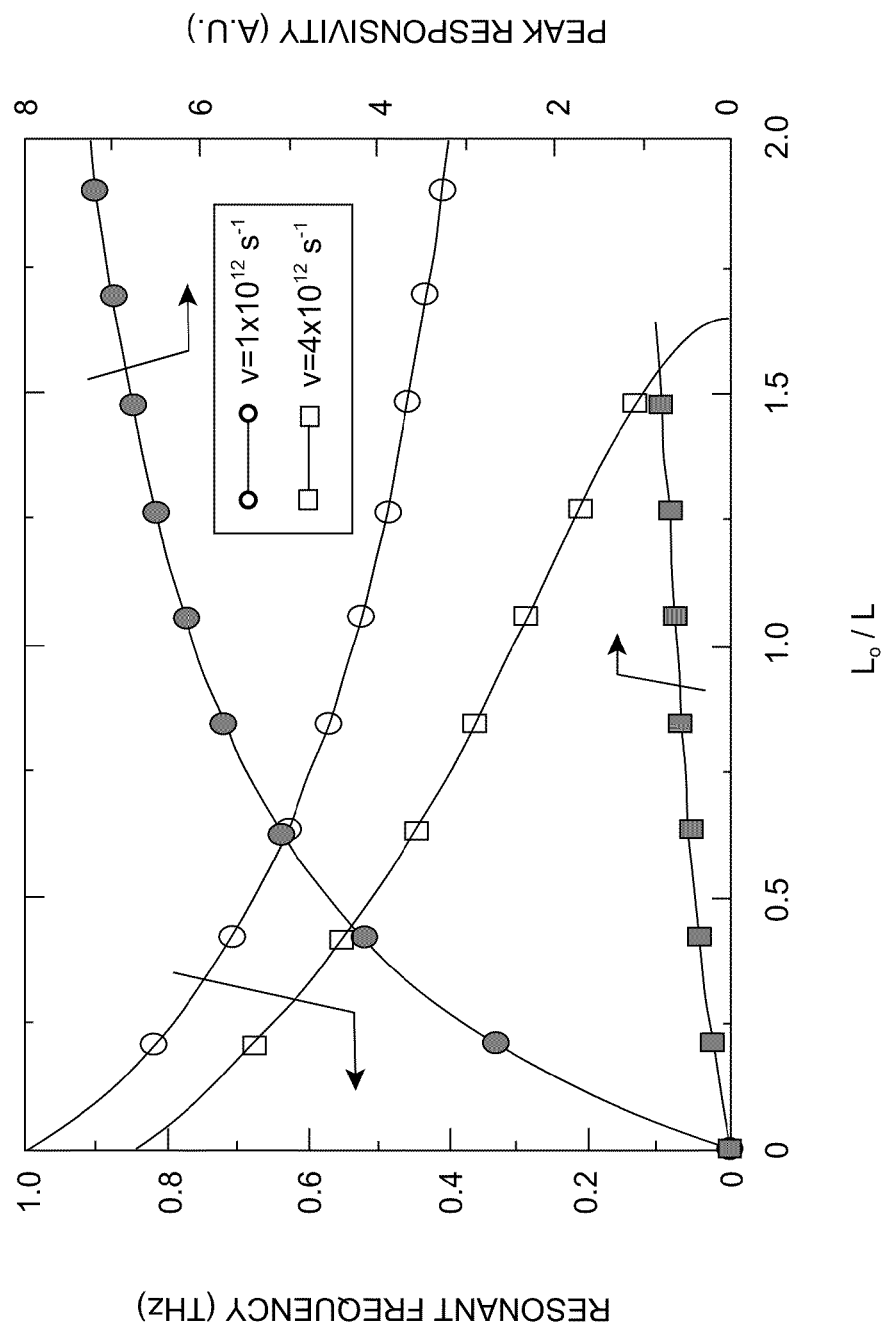
FIG. 7 shows calculated frequencies and peak responsivities versus gate length for symmetrical boundary conditions.
Figure 8:
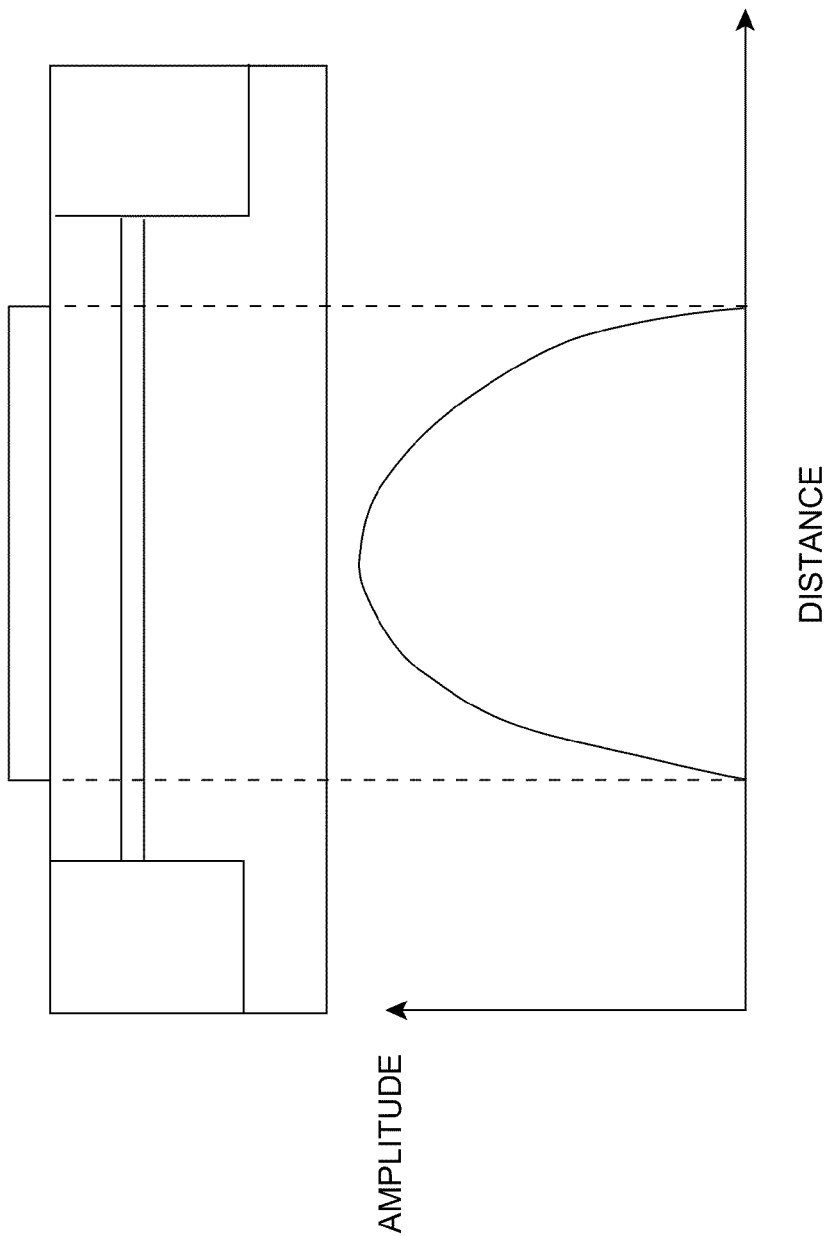
FIG. 8 shows the schematic plasma wave amplitude distribution in the device channel under the gate for symmetrical boundary conditions.

FIG. 7 shows fundamental frequencies of plasma modes and peak responsivities for detection of symmetrical boundary conditions. In particular, FIG. 7 shows calculated frequencies (empty circles and squares) and peak responsivities (filled circles and squares) versus gate length for symmetrical boundary conditions. Additionally, FIG. 8 shows the schematic plasma wave amplitude distribution in the device channel 16 under the gate 20 for symmetrical boundary conditions. Referring to FIGS. 7 and 8, the response can be calculated by solving the complete systems of Maxwell equations while assuming that gate 20 is a perfectly conductive infinitely long strip of width L (e.g., equal to the length of device channel 16) with zero thickness, which is located at the surface of a substrate (at z=0). Further, the electric field of the incident wave $E_0$ exp(-iωt) can be assumed to be polarized across the strip (e.g., along the x-axis), and the two-dimensional device channel 16 was buried into the substrate at a distance d from the surface. The response of device channel 16 can be described by the sheet conductivity $\sigma(\omega)=n_se^2\tau_m/m(1-i\omega\tau_m)$, where $\tau_m$ is the electron momentum scattering time. Using the Galerkin method, the integral equation can be solved numerically through its projection on an orthogonal set of the Chebyshev polynomials within the interval [−L/2; L/2]. As a result, the induced electric fields in the ambient medium can be found by the equation:

$$E_a^{(ind)}(x,z) = E_0^{(r)}\exp(ik_0z) + \int_{+\infty}^{-\infty} E_a^{(sc)}(k_x)\exp(ik_xx + ik_{z,a}z)dk_x \quad (2)$$

and the total electric field in the substrate below the channel can be found by the equation:

$$E_s(x,z) = \quad (3)$$
$$E_0^{(t)}\exp[-ik_0\sqrt{\varepsilon_s}(z+d)] + \int_{-\infty}^{+\infty} E_s^{(sc)}(k_x)\exp[ik_xx - ik_{z,s}(z+d)]dk_x,$$

where $k_{z,\alpha(s)}=\sqrt{k_0^2\in_{\alpha(s)}-k_x^2}$, $\in_\alpha$ and $\in_s$ are the dielectric constants of the ambient media ($\in_\alpha$=1) and substrate, respectively, and $k_0=\omega/c$ with c being the speed of light in a vacuum.

Figure 9:
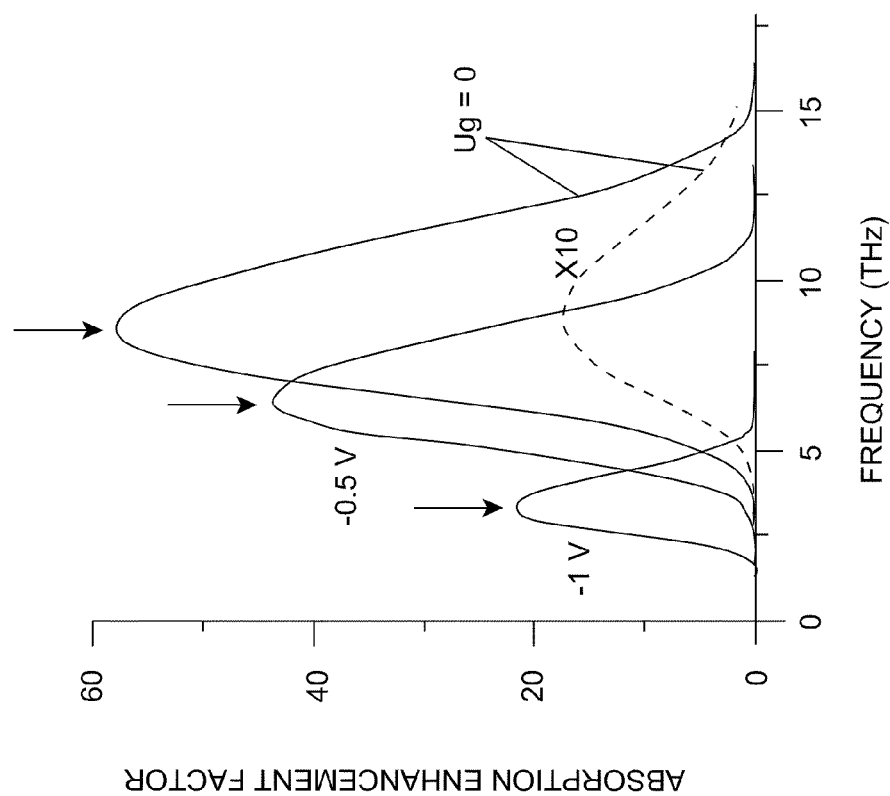
FIG. 9 shows the absorption enhancement factor versus frequency for different gate voltage values.

Further, the absorption enhancement factor can be defined as $|f|=Q/Q_0$, where $Q_0$ is the rate of the Drude absorption per area of the device channel 16 under gate 20 (e.g., per unit width of gate 20). The darkness factor of the resonant absorber can also be defined as A/S. To this extent, FIG. 9 shows the absorption enhancement factor versus frequency for different gate voltage values (e.g., −1 Volt, −0.5 Volts, and 0 Volts). Additional parameters were set at $V_{th}$=−1.17 V, m=0.042 $m_0$, L=60 nm, d=30 nm, $\in$=13.88, τ=7×10$^{-12}$ s (solid line) and τ=2.3×10$^{-13}$ s (dashed line). The arrows mark the frequencies of plasma resonances that were calculated using Equation (1) from above. FIG. 9 illustrates how the resonant absorption response can be tuned through the entire terahertz range of frequencies by varying the bias voltage applied to the gate, e.g., gate 20 (FIG. 1). Further, as can be seen in FIG. 9, the absorption enhancement factor comprises large values (e.g., up to sixty) at cryogenic temperatures (e.g., τ=7×10$^{-12}$ s) and remains greater than unity even at room temperature (e.g., τ=2.3×10$^{-13}$ s). Still further, FIG. 9 shows that the peak value of the absorption enhancement factor increases as the resonance frequency increases.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of manufacturing a device for managing radiation, the method comprising:

manufacturing a field effect transistor including a device channel, a first edge contact adjacent to a first edge of the device channel and a second edge contact adjacent to a second edge of the device channel, the manufacturing the field effect transistor including:

determining a point on the device channel at which an amplitude of a fundamental frequency of a plasma wave induced in the device channel by the radiation is at or proximate to its maximum when the first edge and the second edge comprise substantially equal bias potentials; and forming at least one channel contact contacting the device channel at the point;

manufacturing at least one additional field effect transistor including a device channel, a first edge contact adjacent to a first edge of the device channel, a second edge contact adjacent to a second edge of the device channel, a gate, and a channel contact contacting the device channel of the second field effect transistor at a point on the device channel at which an amplitude of a fundamental frequency of a plasma wave induced in the device channel by the radiation is at or proximate to its maximum when the first edge and the second edge comprise substantially equal bias potentials; and connecting at least one component of each of the field effect transistor and the at least one additional field effect transistor with a set of connectors.

2. The method of claim 1, further comprising selecting an overall dimension of the device based on a desired wavelength of the radiation.

3. The method of claim 1, wherein the manufacturing the field effect transistor further includes forming a gate of the field effect transistor above an active layer of the field effect transistor including the device channel of the field effect transistor.

4. The method of claim 3, wherein the at least one channel contact of the field effect transistor is formed below the gate of the field effect transistor.

5. The method of claim 3, wherein the at least one channel contact of the field effect transistor is formed adjacent to the gate of the field effect transistor.

6. The method of claim 1, further comprising selecting at least one of: a size of each field effect transistor in the device or a number of additional field effect transistors in the device based on a desired frequency of the radiation.

7. The method of claim 1, wherein the field effect transistor and one of the at least one additional field effect transistor share an edge contact.

* * * * *